United States Patent [19]

De Keyzer et al.

[11] Patent Number: 5,231,524
[45] Date of Patent: Jul. 27, 1993

[54] METHOD OF MANUFACTURING A TOP COAT

[75] Inventors: Gerardus C. M. De Keyzer; Antonius H. M. Raaijmakers; Petrus E. M. Baltussen; Henricus G. J. A. M. Luijben, all of Eindhoven, Netherlands

[73] Assignee: U.S. Philips Corporation, New York, N.Y.

[21] Appl. No.: 925,353

[22] Filed: Aug. 4, 1992

Related U.S. Application Data

[63] Continuation-in-part of Ser. No. 655,007, Feb. 12, 1991, Pat. No. 5,157,527.

[30] Foreign Application Priority Data

May 29, 1992 [EP] European Pat. Off. ........ 92201521.9

[51] Int. Cl.$^5$ ..................... G02F 1/133; C09K 19/00; B05D 5/00
[52] U.S. Cl. ......................... 359/74; 359/79; 428/1; 427/284
[58] Field of Search ................ 359/66, 74, 79; 428/1, 428/313, 357, 361, 558; 427/256, 258, 284

[56] References Cited

U.S. PATENT DOCUMENTS

| | | | |
|---|---|---|---|
| 4,422,727 | 12/1983 | Baeger et al. | 359/74 |
| 4,779,957 | 10/1988 | Suginoya et al. | 359/74 |
| 5,118,372 | 6/1992 | Spahn | 427/258 |
| 5,157,527 | 10/1992 | De Keyzer et al. | 359/74 X |

FOREIGN PATENT DOCUMENTS 0448139 9/1991 European Pat. Off.

Primary Examiner—William L. Sikes
Assistant Examiner—Huy K. Mai
Attorney, Agent, or Firm—Norman N. Spain

[57] ABSTRACT

A top coat comprising an acrylic resin is provided on a substrate by means of printing techniques. Various compositions of the starting material (difunctional, trifunctional and tetrafunctional acrylates and possible additives) are described. The resultant top coat is hard and has slanting portions at its edges.

19 Claims, 2 Drawing Sheets

METHOD OF MANUFACTURING A TOP COAT

RELATED APPLICATIONS

This application is a continuation-in-part of application Ser. No. 07/655,007, filed Feb. 12, 1991, now U.S. Pat. No. 5,157,527.

The invention relates to a method of manufacturing a top coat comprising an acrylic resin on a substrate, which top coat gradually decreases in thickness at its edges.

Such a top coat may be used as a protective layer for a color filter in, for example a (liquid crystal) display device, but also in, for example charge-coupled devices for picking up pictures. If it is sufficiently thick, such a top coat used in, for example, a black-white liquid crystal display device may also prevent crosstalk between lines and columns via metal strips located below the top coat and forming a black matrix.

A gradual decrease in thickness at the edges is understood to mean that the top coat, viewed in a cross-section, acquires an increasingly smaller thickness at an edge in the outward direction, but due to the manufacturing process may have a local raised portion in the inward direction.

The invention also relates to a display device provided with such a top coat.

A method of the type described in the opening paragraph is known from EP-A-448.139 (PHN 13.252). This Application describes a method in which top coat material is left free for some time after it has been provided, causing it to flow freely to a slight extent at the edges, which results in slanting portions.

Particularly when used in liquid crystal display devices, this type of top coat must satisfy a number of requirements. For example, the top coat must be resistant to subsequent manufacturing steps such as, for example the provision of transparent conducting racks such as indium tin oxide. The top coat should be both resistant to the etching materials used and there should be no undulation of the top coat (and a possible color filter) at the temperatures used. These deposition temperatures are preferably chosen to be high (180°–200° C.) because the recrystallization of the indium tin oxide is then maximal so that the resistivity of the conducting tracks is minimal.

The top coat should preferably not extend beyond the actual display portion because already other connection tracks may be present at that area on the substrate, for example, for chip-on-glass connections. It is therefore advantageous if the top coat can be patterned. However, the top coat should not cease abruptly because ruptures may then occur at the area of the edge in conductor tracks which extend beyond the edge.

Moreover, said top coat should be resistant to indentation by spacers which determine the thickness of the liquid crystal layer.

SUMMARY OF THE INVENTION

It is, inter alia, an object of the present invention to provide a number of acrylic resins which are suitable for use in a method of the type described in the opening paragraph.

It is a further object of the invention to provide a number of methods of patterning the acrylic resins.

To this end the method according to the invention is characterized in that the material for manufacturing the top coat comprises at least one acrylate from the group of difunctional, trifunctional and tetrafunctional acrylates and an UV initiator and is patterned on the substrate by means of a printing technique, whereafter the material is polymerized by means of UV radiation. Difunctional, trifunctional and tetrafunctional acrylates are herein understood to mean acrylate which comprise 2, 3 and 4 acrylates groups, respectively. The printing technique is herein understood to mean relief (or letter-press) printing, intaglio printing and planographic printing, as will be elucidated hereinafter.

BRIEF DESCRIPTION OF THE DRAWING

In the drawing:

FIG. 5 shows diagrammatically a profile of a top coat obtained by means of a method according to the invention and a printing technique according to FIG. 2, while

Figure 1:
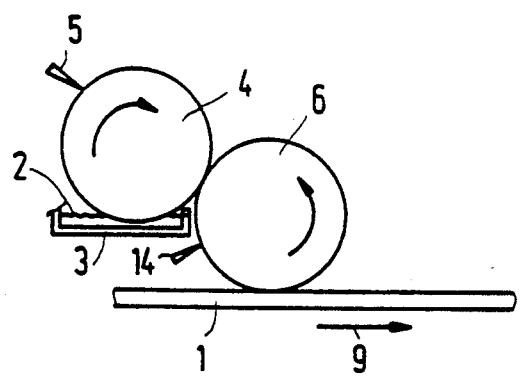
FIG. 1 shows diagrammatically a method of providing patterned layers on a substrate.

For a satisfactory operation the material to be provided before curing should have such a rheological behavior that it is slightly flattened after it has been provided on the substrate so that the thickness gradually decreases at the area of the edges, while this material still has a viscosity rendering it suitable for use in the relevant printing technique. To this end a first preferred embodiment of the material comprises at most 80% by weight of one or more trifunctional acrylates. At a percentage of more than 80 the material hardly flattens within a period suitable for industrial uses.

Examples of trifunctional acrylates are trimethylol propane triacrylate or ethoxylated versions thereof and pentaerythritol triacrylate.

The rheological behavior is also influenced by the choice of a suitable additive.

In a second preferred embodiment the material for manufacturing the top coat comprises at least one difunctional acrylate. These acrylates decrease the viscosity of the trifunctional acrylate but may also individually form the material to be provided. Examples of difunctional acrylates are hexanediol diacrylate, tripropylene glycol diacrylate or dipropylene glycol diacrylate.

In a third preferred embodiment the material for manufacturing the top coat comprises, in addition, at least one monoacrylate. Examples of such acrylates are phenoxy ethyl acrylate, isobornyl acrylate and tetrahydrofurfuryl acrylate; these acrylates also reduce the viscosity.

It is alternatively possible to use other reactive thinners such as N-vinyl pyrrolidone instead of the diacrylates or monoacrylates.

The material is preferably polymerized in an inert atmosphere and, dependent on the starting material and the UV dose used (intensity), takes 0.5–10 minutes.

The techniques of relief printing, intaglio printing and planographic printing may be used. Relief printing techniques are herein understood to mean techniques in which the parts taking up material and transferring it to the substrate are raised wit respect to the other parts on a medium transferring the material to be provided on the substrate. In intaglio printing techniques the parts taking up material and transferring it are lowered with respect to the other parts, while in planographic printing techniques the different parts are present on one and the same surface, due to, for example, a chemical treatment.

These and other aspects of the invention will be apparent from and elucidated with reference to the following embodiments and the drawing.

FIG. 1 shows a device for patterning a top coat material on a substrate 1. The pattern to be provided consists of, for example a matrix of rectangular layers constituting, for example protective layers at the location of a color filter; the substrate is divided into separate parts at a later stage. The pattern to be provided may alternatively comprise a number of parts of a substrate which must be protected and on which, for example metal tracks must be deposited. A reservoir 3 contains the material 2 to be provided which is taken up by an engraving roller 4 which is made of metal and has grooves for taking up the material 2; depth and width of the grooves determine the quantity of material taken up. Superfluous material is removed by means of a scraper or doctor blade 5.

Figure 2:
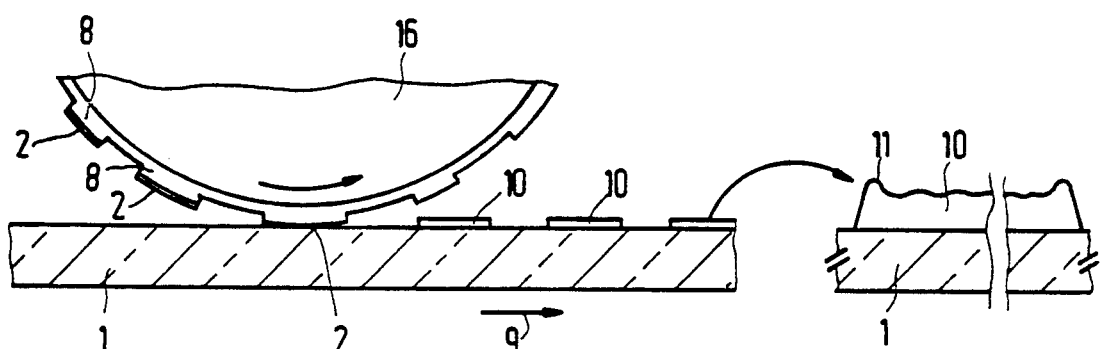
FIGS. 2 to 4 show diagrammatically a number of possible way of performing the method as shown in FIG. 1.

The material 2 is subsequently transferred to a printing roller 6. In the case of relief printing (FIG. 2) it comprises a metal roller 16, provided with a rubber plate 7 having projections 8. Other types of projections 8 are alteratively suitable, for example metal projections; the printing roller 6 is then manufactured as one piece. At the areas where the printing roller 6 contacts the substrate 1, for example glass or quartz, the material 2 is transferred to this substrate in accordance with the pattern of the projections 8. The substrate 1 is simultaneously moved along the printing roller, which is indicated by means of the arrow 9. The material 2 is left in a patterned form on the substrate 1, which is indicated by the areas 10.

The printing roller 6 has dented the substrate 1 in such a way that the substrate is satisfactory wetted, but this dent is preferably as small as possible ($<0.2$ mm) because otherwise the material 2 may accumulate at the edges. There is always some accumulation so that the areas 10 always have a slightly raised portion 11 at their edges (approximately 0.5 $\mu$m to an overall thickness of 2–3 $\mu$m). In a typical example the areas 10 have dimensions of 9 cm $\times$ 12 cm (in, for example LCD uses). A stamp may be alternatively used instead of the printing roller 6.

The material 2 comprises an acrylate and has such a viscosity that it is slightly flattened after it has been provided on the substrate 1, while the raised portion 11 decreases in height and other unevennesses in the surface are substantially leveled out.

If necessary, the material 2 further comprises additives which reduce its viscosity. These may be difunctional acrylates such as, for example hexanediol diacrylate, tripropylene glycol diacrylate or dipropylene glycol diacrylate. To this end the material comprises, for example 50–80% by weight of a trifunctional acrylate such as pentaerythritol triacrylate, 15–20% by weight of a difunctional acrylate such as hexanediol diacrylate and 3–6% by weight of an UV initiator. The trifunctional acrylate may be replaced entirely or partly by a tetrafunctional acrylate such as pentaerythritol tetraacrylate.

Suitable additives for reducing the viscosity are monoacrylates such as, for example phenoxy ethyl acrylate, isobornyl acrylate or tetrahydrofurfuryl acrylate. Another suitable additive is, for example N-vinyl pyrrolidone. For a maximmally efficient use of the printing method the material 2 does not comprise any further solvents. In a typical example, in which the material 2 comprises approximately 75% by weight of pentaerythritol triacrylate, 20% by weight of N-vinyl pyrrolidone and 5% by weight of other ingredients (photo initiator, surfactants), the viscosity is approximately 100 milliPascalsec. The maximum layer thickness after printing is 1–3 $\mu$m.

Another suitable starting material comprised 94–97% by weight of a difunctional acrylate, for example hexane diol diacrylate or a mixture of difunctional acrylates.

Figure 3:
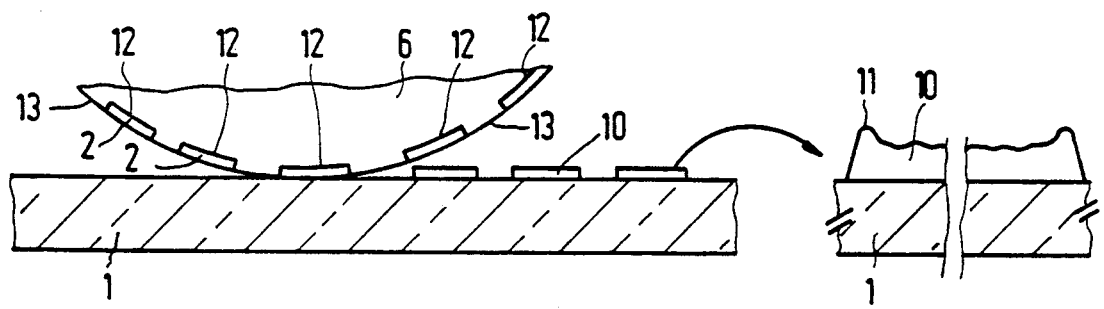
Figure 4:
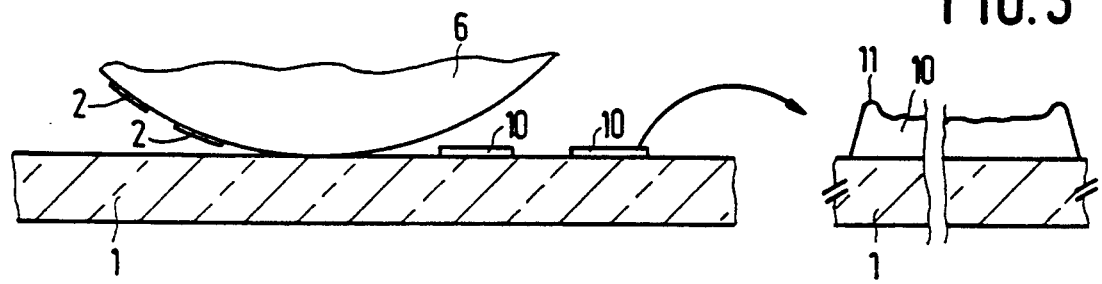

In an intaglio printing method (FIG. 3) the material 2 to be provided is transferred to depressions 12 provided in the printing roller 6 in accordance with the pattern to be provided. To remove superfluous material from the exterior surface 13, a doctor blade 14 (FIG. 1) may be used, if necessary. The use of a planographic printing method is alternatively possible (FIG. 4), in which surface parts of a printing roller 6 are selectively wetted with the material 2.

Figure 5:
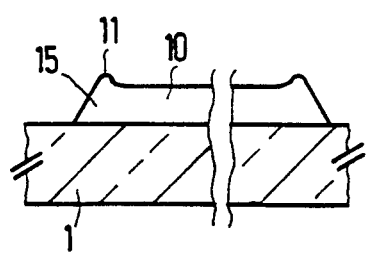

Subsequently the layer 10 is left free for a short time (0.5 to 10 minutes) causing it to flatten to some extent, which results in slanting portions 15 (FIG. 5). Finally the layer 10, 15 is polymerized by means of UV radiation while excluding oxygen. The presence of oxygen leads to softening of the layer due to a lower degree of polymerization.

Figure 6:
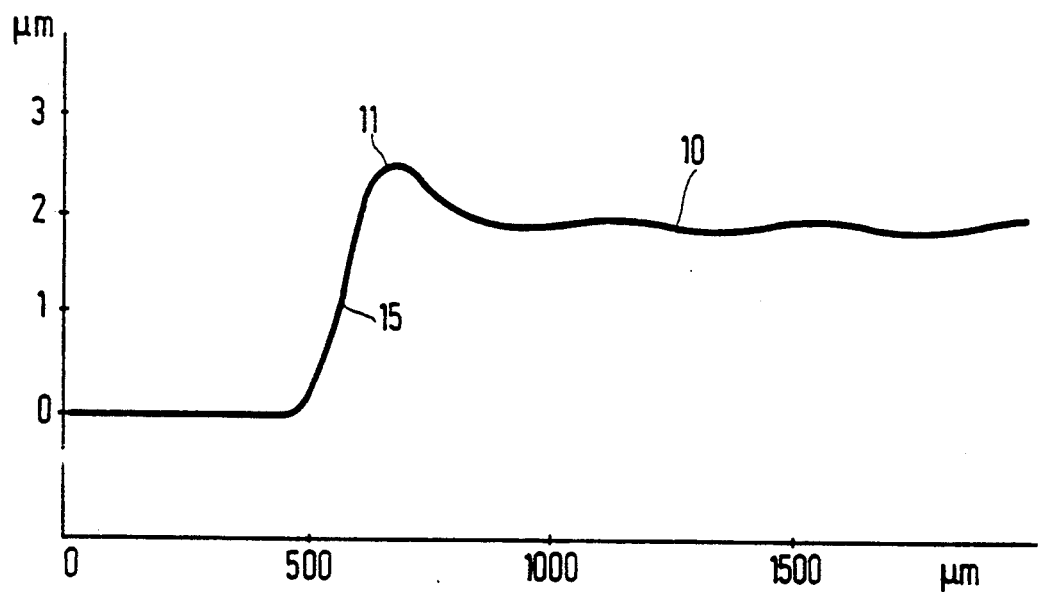
FIG. 6 shows a measured profile of such a top coat and FIG. 7 is a diagrammatical crosssection of a display device according to the invention.

FIG. 6 shows a measured profile or a protective layer which is obtained by means of the method described (relief printing, use of pentaerythritol triacrylate with N-vinyl pyrrolidone as an additive, a short waiting time and subsequent curing). The layer thickness of the layer 1, 10, is 2 $\mu$m in this example. The raised portion 11 at the edge 15 is approximately 0.5 $\mu$m maximum. To obtain thicker layers, the printing process may be repeated.

Figure 7:
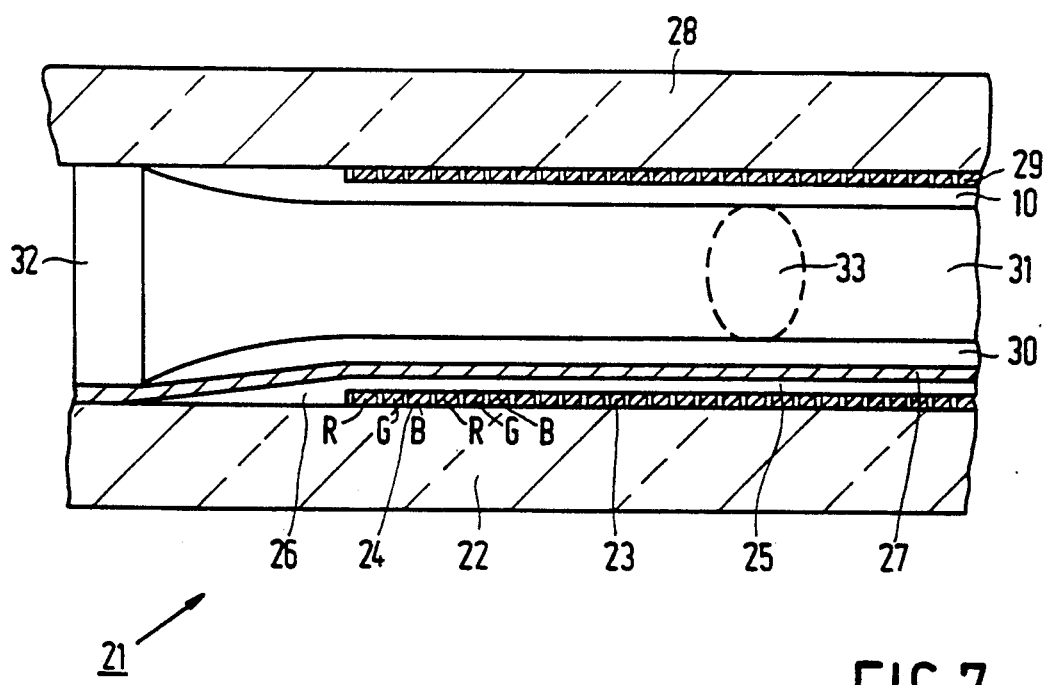

FIG. 7 shows diagrammatically a part of a display device 21 having a first substrate 22 of glass, quartz or anther suitable material. A color filter 23, in this example comprising red (R), green (G) and blue (B) color cells 24 corresponding to pixels is provided on the substrate 2 by means of methods which are conventional in the liquid crystal technology. Moreover, the color filter may comprise a "black matrix". In a monochrome display device the substrate may also comprise only such a black matrix of, for example chromium.

The color filter 23 is provided with a top coat 25 comprising a polymerized acrylic resin of one or more of the above-mentioned types and gradually decreasing in thickness at the area of the edges (area 26), for example with a slope of 1° and 2°.

The top coat 25 is provided with a metallization pattern 27 consisting of, for example transparent indium tin oxide (ITO) electrodes, coated with a layer of $SiO_2$. In a device according to the invention indium tin oxide can be deposited at a comparatively high temperature without undulation or roughening of the top coat 25. Such a high deposition temperature leads to ITO electrodes having a very low resistance. Possible etching baths to be used for patterning the ITO layer do not attack the top coat 25.

The device further comprises a second substrate 28 on which electrodes 29 are provided which define pixels, either because the electrodes 29 and the metallization pattern 27 constitute a cross-bar system in which the crossings define the pixels (passive drive), or because the electrodes 29 constitute picture electrodes which are driven by a system (not shown) of switching elements, drive and data lines (active drive); in the latter case the electrode 27 may have a single flat structure.

A layer of liquid crystal material 31 is present between the two substrates 22, 28 which, if necessary, are provided with protective/orienting layers 30. The two substrates are held at a substantially constant distance from each other by means of a sealing edge 32 and spacers 33. The device may be further provided with polarizers, reflectors, etc. in the conventional manner.

Since the top coat 25, 26 according to the invention is hard (and thus scratch-resistant), there is no risk of indentation of this layer at the area of spacers 33.

We claim:

1. A method of manufacturing a top coat comprising an acrylic resin on a substrate, which top coat gradually decreases in thickness at its edges, characterized in that the material for manufacturing the top coat comprises at least one acrylate selected from the group consistency of difunctional, trifunctional and tetrafunctional acrylates and an UV initiator and is patterned on the substrate by means of a printing technique, whereafter the material is polymerized by means of UV radiation.

2. A method as claimed in claim 1 characterized in that the material for manufacturing the top coat comprises at most 80% by weight of at least one trifunctional acrylate.

3. A method as claimed in claim 1, characterized in that the material for manufacturing the top coat comprises 50-80% by weight of at least one trifunctional acrylate and 15-50% by weight of at least one difunctional acrylate.

4. A method as claimed in claim 1, characterized in that the material for manufacturing the top coat comprises 94-97% by weight of at least one difunctional acrylate.

5. A method as claimed in claim 1 characterized in that the trifunctional acrylate comprises trimethylol propane triacrylate or an ethoxylated trimethylol propane triacrylate or pentaerythritol triacrylate.

6. A method as claimed in 1, characterized in that the difunctional acrylate comprises hexanediol diacrylate, tripropylene glycol diacrylate or dipropylene glycol diacrylate.

7. A method as claimed in 1, characterized in that the material for manufacturing the top coat comprises at least one monoacrylate or N-vinyl pyrrolidone.

8. A method as claimed in claim 7, characterized in that the monoacrylic resin comprises phenoxyethyl acrylate, isobornyl acrylate or tetrahydrofurfuryl acrylate.

9. A method as claimed in claim 1, characterized in that the printing technique used is an intaglio, a relief or a planographic printing technique.

10. A method as claimed in claim 2 characterized in that the trifunctional acrylate comprises trimethylol propane triacrylate or an ethoxylated trimethylol propane triacrylate or pentaerythritol triacrylate.

11. A method as claimed in claim 3 characterized in that the trifunctional acrylate comprises trimethylol propane triacrylate or an ethoxylated trimethylol propane triacrylate or pentaerythritol triacrylate.

12. A method as claimed in claim 2 characterized in that the difunctional acrylate comprises hexanediol diacrylate, tripropylene glycol diacrylate or dipropylene glycol diacrylate.

13. A method as claimed in claim 3 characterized in that the difunctional acrylate comprises hexanediol diacrylate, tripropylene glycol diacrylate or dipropylene glycol 14. A method as claimed in claim 4 characterized in that the difunctional acrylate comprises hexanediol diacrylate, tripropylene glycol diacrylate or dipropylene glycol diacrylate.

15. A method as claimed in claim 2 characterized in that the material for manufacturing the top coat comprises at least one monoacrylate or N-vinyl pyrrolidone.

16. A method as claimed in claim 3 characterized in that the material for manufacturing the top coat comprises at least one monoacrylate or N-vinyl pyrrolidone.

17. A method as claimed in claim 4 characterized in that the material for manufacturing the top coat comprises at least one monoacrylate or N-vinyl pyrrolidone.

18. A substrate comprising a top coat which gradually decreases in thickness at its edges, characterized in that the material of the top coat comprises at least a difunctional, a trifunctional or a tetrafunctional acrylate.

19. An electro-optical display device comprising a display medium between two supporting plates, characterized in that the display device comprises a substrate wherein the substrate comprising a top coat which gradually decrease in thickness at its edges, characterized in that the material of the top coat comprising at least a difunctional, a trifunctional or tetrafunctional acrylate.

* * * * *